(12) United States Patent
Kim et al.

(10) Patent No.: US 12,347,694 B2
(45) Date of Patent: Jul. 1, 2025

(54) METHOD AND APPARATUS FOR TREATING SUBSTRATE

(71) Applicant: SEMES CO., LTD., Cheonan-si (KR)

(72) Inventors: Dong-Hun Kim, Seoul (KR); Jae Hwan Kim, Gwangmyeong-si (KR); Hye Joon Kheel, Hwaseong-si (KR); Gun Woo Kim, Incheon (KR); Tae Hyeon Jeon, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 272 days.

(21) Appl. No.: 17/902,110

(22) Filed: Sep. 2, 2022

(65) Prior Publication Data

US 2023/0073489 A1 Mar. 9, 2023

(30) Foreign Application Priority Data

Sep. 6, 2021 (KR) .......................... 10-2021-0118238

(51) Int. Cl.
*H01L 21/311* (2006.01)
*H01J 37/32* (2006.01)

(52) U.S. Cl.
CPC .... *H01L 21/31116* (2013.01); *H01J 37/3244* (2013.01); *H01J 37/32724* (2013.01); *H01J 37/32834* (2013.01); *H01J 37/32422* (2013.01); *H01J 2237/2007* (2013.01); *H01J 2237/334* (2013.01)

(58) Field of Classification Search
CPC ......... H01L 21/31116; H01L 21/67103; H01L 21/6833; H01L 21/02164; H01L 21/0217; H01L 21/67069; H01J 37/3244; H01J 37/32724; H01J 37/32834; H01J 37/32422; H01J 2237/2007; H01J 2237/334
USPC ........................................................ 438/723
See application file for complete search history.

(56) References Cited

U.S. PATENT DOCUMENTS

2016/0196969 A1* 7/2016 Berry, III .......... H01L 21/02252
438/694

FOREIGN PATENT DOCUMENTS

KR 10-2020-0074032 A 6/2020

OTHER PUBLICATIONS

Translation of CN 113178387A (Year: 2021).*

* cited by examiner

*Primary Examiner* — Duy Vu N Deo
(74) *Attorney, Agent, or Firm* — Harness, Dickey & Pierce, P.L.C.

(57) ABSTRACT

Provided is a substrate treating method of removing a thin film formed on a substrate. The substrate treating method includes a reaction process of transferring an etchant to the thin film, and a removal process of removing process by-products generated by reacting the thin film with the etchant, in which the reaction process and the removal process are repeated at least twice or more, and any one of the removal processes is to remove partially the process by-products.

16 Claims, 7 Drawing Sheets

METHOD AND APPARATUS FOR TREATING SUBSTRATE

CROSS-REFERENCE TO RELATED APPLICATIONS

This application claims priority to and the benefit of the Korean Patent Application No. 10-2021-0118238 filed in the Korean Intellectual Property Office on Sep. 6, 2021, the entire contents of which are incorporated herein by reference.

TECHNICAL FIELD

The present invention relates to a method for treating a substrate and an apparatus for treating a substrate.

BACKGROUND ART

In order to manufacture a semiconductor device, a desired pattern is formed on a substrate such as a wafer through various processes such as photography, etching, ashing, ion implantation, and thin film deposition on the substrate. Various treating liquids and treating gases are used in each process.

During the process for manufacturing the semiconductor device as described above, a thin film removal process for removing a thin film formed on the substrate may be performed. For example, the thin film removal process of processing the thin film on the substrate to a desired thickness may be performed.

FIGS. 1 and 2 are views schematically illustrating a state in which the thin film formed on the substrate is removed. Referring to FIGS. 1 and 2, an etchant such as $NH_4F$, $HF$, and $F^*$ is supplied to $SiO_2$— and $Si_3N_4$ thin films to generate a process by-product $(NH_4)_2SiF_6$, and the substrate is heated and a treating space in which the substrate is to be provided is exhausted to remove the process by-product. The process of generating the process by-product by reacting the etchant with the thin film may be referred to as a reaction process, and the process of removing the process by-product may be referred to as a removal process. The reaction process and the removal process may be defined as one process cycle, and this process cycle may be repeated multiple times. FIG. 1 may be a state in which a first process cycle is performed, and FIG. 2 may be a state in which a second process cycle is performed.

However, when the process cycle is repeatedly performed, the roughness of the thin film formed on the substrate may deteriorate. Specifically, the removal rate of the thin film formed on the substrate is affected by a temperature of the substrate and a reaching amount of the etchant transferred onto the substrate. If the reaching amount of the etchant transferred onto the substrate is constant, the removal rate of the thin film formed on the substrate varies according to the temperature of the substrate. Specifically, a minute error inevitably occurs in the temperature for each area of the substrate, and a thin film removal rate in an area with a relatively low temperature and a thin film removal rate in an area with a relatively high temperature are different from each other. That is, there is a deviation occurring between the thin film removal amount in the area with the relatively low temperature and the thin film removal amount in the area with the relatively high temperature.

Accordingly, when the above-described process cycle is repeatedly performed, the deviation in the thin film removal amount described above is continuously accumulated, and the roughness of the surface of the thin film formed on the substrate is deteriorated.

SUMMARY OF THE INVENTION

The present invention has been made in an effort to provide a method for treating a substrate and an apparatus for treating a substrate capable of efficiently treating the substrate.

The present invention has also been made in an effort to provide a method for treating a substrate and an apparatus for treating a substrate capable of improving the roughness of a thin film formed on the substrate.

The problem to be solved by the present invention is not limited to the above-mentioned problems, and the problems not mentioned will be clearly understood by those skilled in the art from the present specification and the accompanying drawings.

An exemplary embodiment of the present invention provides a substrate treating method of removing a thin film formed on a substrate. The substrate treating method includes a reaction process of transferring an etchant to the thin film, and a removal process of removing process by-products generated by reacting the thin film with the etchant, in which the reaction process and the removal process may be repeated at least twice or more, and any one of the removal processes may be to remove partially the process by-products.

In the exemplary embodiment, the other one of the removal processes may be to remove fully the process by-products.

In the exemplary embodiment, another one of the removal processes may be a removal process performed the last among the removal processes.

In the exemplary embodiment, the removal process may be performed by heating the substrate and exhausting an atmosphere of a treating space in which the substrate is placed.

In the exemplary embodiment, the amount of the process by-products removed in the removal process may be adjusted by controlling a time for exhausting the atmosphere of the processing space and/or an exhaust pressure for exhausting the treating space.

In the exemplary embodiment, in the reaction process or the removal process, at least two or more heaters for heating different areas of the substrate may be independently controlled so that a temperature deviation for each area of the substrate is decreased.

In the exemplary embodiment, the thin film may be provided with a material containing silicon.

In the exemplary embodiment, the etchant may include at least one of nitrogen, hydrogen, and fluorine.

Another exemplary embodiment of the present invention provides a method for treating a substrate on which a thin film containing silicon is formed. The substrate treating method includes a reaction process of transferring an etchant to the thin film; and a removal process of removing process by-products generated by reacting the thin film with the etchant, in which the reaction process and the removal process may be performed at least two or more times, and at least any one of the removal processes may be to remove only partially the process by-products.

In the exemplary embodiment, the reaction process may be performed by generating plasma by exciting a gas containing fluorine, removing ions from the generated plasma, and generating the etchant by supplying a gas containing nitrogen and hydrogen to a neutral gas from which the ions have been removed.

In the exemplary embodiment, the etchant may include at least one of NxHyFz and HxFy.

In the exemplary embodiment, the etchant may include at least one of $NH_4F$ and HF.

In the exemplary embodiment, the thin film may include at least one of SiOx and SixNy.

In the exemplary embodiment, the thin film may include at least one of $SiO_2$ and $Si_3N_4$.

In the exemplary embodiment, the reaction process and the removal process may be repeated at least twice or more.

In the exemplary embodiment, the removal process performed before the last among the removal processes may be performed by removing only partially the process by-products, and the removal process performed the last among the removal processes may be performed by removing fully the process by-products.

Yet another exemplary embodiment of the present invention provides an apparatus for treating a substrate including: a housing defining a treating space; a chuck for supporting a substrate in the treating space, wherein the chuck is provided with a heater for heating the substrate; a heater power supply module for applying electric power to the heater; an electrode for generating plasma in a plasma space provided above the treating space; an electrode power supply module for applying electric power to the heater; an ion blocker disposed between the plasma space and the treating space; a first gas supply unit for supplying a first gas including nitrogen and hydrogen as a neutral gas from which ions have been removed by the ion blocker; a second gas supply unit for supplying a second gas containing fluorine to the plasma space; an exhaust unit exhausting an atmosphere of the treating space; and a controller, in which the controller may control the first gas supply unit, the second gas supply unit, and the power supply module so as to supply the second gas to the plasma space, generate the plasma in the plasma space, and generate an etchant by supplying the first gas to a neural gas passing through the ion blocker, and control the exhaust unit and/or the heater power supply module so as to remove only partially the process by-products generated by supplying the etchant to a thin film formed on the substrate.

In the exemplary embodiment, the controller may control the first gas supply unit, the second gas supply unit, the power supply module, and the exhaust unit so as to repeating the supplying of the etchant and the removing of the process by-products at least two or more times.

In the exemplary embodiment, the controller may control the exhaust unit and/or the heater power supply module so as to remove only partially the process by-products in a process performed before the last among the processes of removing the process by-products, and control the exhaust unit and/or the heater power supply module so as to remove fully the process by-products in a process performed the last among the processes of removing the process by-products.

In the exemplary embodiment, the thin film formed on the substrate may be provided with a material containing silicon.

According to an exemplary embodiment of the present invention, it is possible to efficiently treat a substrate.

Further, it is possible to improve the roughness of a thin film formed on the substrate.

The effect of the present invention is not limited to the foregoing effects, and non-mentioned effects will be clearly understood by those skilled in the art from the present specification and the accompanying drawings.

DETAILED DESCRIPTION

Figure 1:
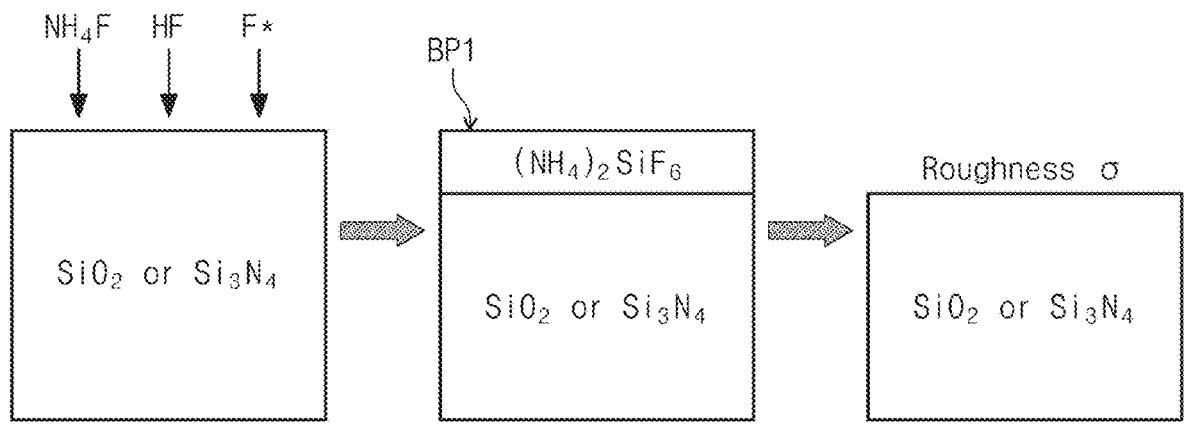
FIGS. 1 and 2 are diagrams schematically illustrating a state in which a thin film formed on a substrate is removed.
Figure 2:
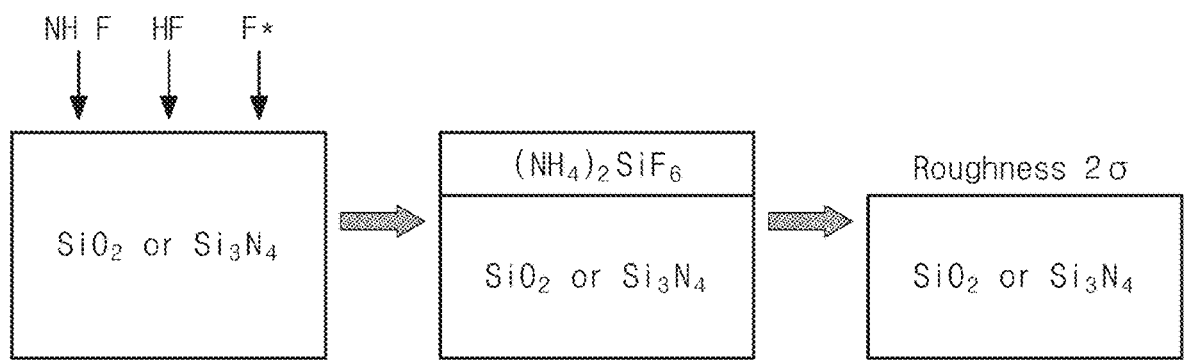

Hereinafter, exemplary embodiments of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of "including" any component will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

The singular expression includes the plural expression unless the context clearly dictates otherwise. Accordingly, shapes, sizes, and the like of the elements in the drawing may be exaggerated for clearer description.

Terms, such as first and second, are used for describing various constituent elements, but the constituent elements are not limited by the terms. The terms are used only for distinguishing one component from the other component. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~", and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Hereinafter, an exemplary embodiment of the present invention will be described with reference to FIGS. 3 to 11.

Figure 3:
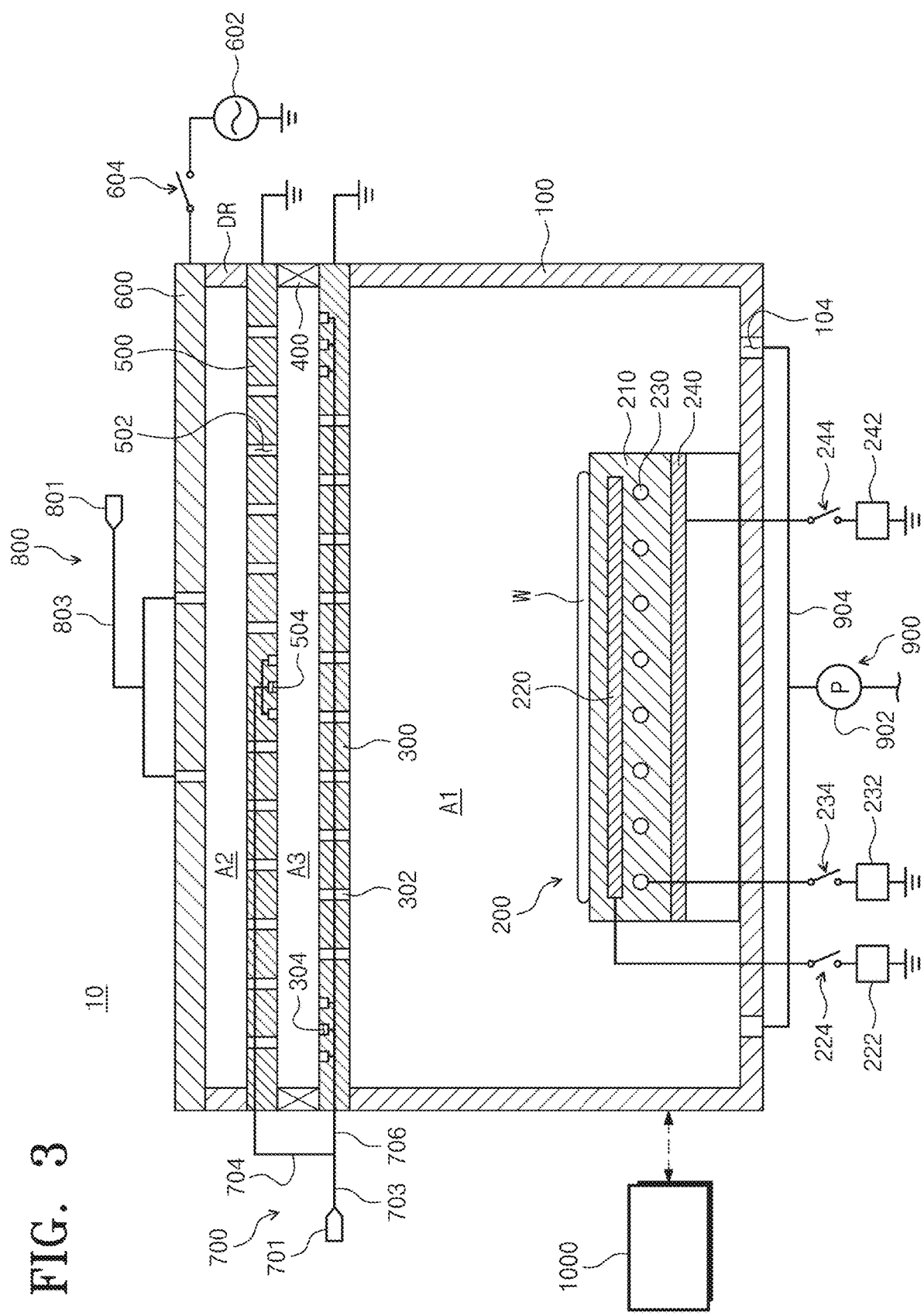
FIG. 3 is a diagram illustrating a substrate treating apparatus according to an exemplary embodiment of the present invention.

FIG. 3 is a diagram illustrating a substrate treating apparatus according to an exemplary embodiment of the present invention. Referring to FIG. 3, a substrate treating apparatus 10 according to an exemplary embodiment may treat a substrate W. The substrate treating apparatus 10 may treat the substrate W using plasma. The substrate treating apparatus 10 may remove a thin film formed on the substrate W using plasma. For example, the substrate treating apparatus 10 may control the thickness of a thin film L formed on the substrate W by transferring an etchant to the substrate W. The substrate treating apparatus 10 includes a housing 100, a chuck 200, a shower head 300, a heating member 400, an ion blocker 500, an insulating member DR, an upper electrode 600 (an example of a second electrode), gas supply units 700 and 800, an exhaust unit 900, and a controller 1000.

The housing 100 and the shower head 300 may be combined with each other to define a treating space A1 (an example of a first space) that is a space in which the substrate W is treated. In addition, the shower head 300, the heating member 400, and the ion blocker 500 are combined with each other to define a mixing space A3 (an example of a third space) that is a space for mixing a neutral gas (radical) from which ions I have been removed and a first process gas G1 supplied by a first gas supply unit 700. In addition, the ion blocker 500, the insulating member DR, and the upper electrode 600 may be combined with each other to define a plasma space A2 (an example of a second space) that is a space in which plasma P is generated. In addition, components involved in defining the treating space A1, the plasma space A2, and the mixing space A3 may be collectively referred to as a chamber.

The housing 100 may define the treating space A1. For example, the housing 100 may be combined with the shower head 300 to be described below to define the treating space A1. The housing 100 may have a cylindrical shape with an opened upper portion. An inner wall of the housing 100 may be coated with a material capable of preventing the inner wall from being etched by the plasma P to be described below. For example, the inner wall of the housing 100 may be coated with a dielectric film such as ceramic. In addition, the housing 100 may be grounded. In addition, an opening (not illustrated) may be formed in the housing 100 to allow the substrate W to be carried in to the treating space A1 or carried out from the treating space A1. The opening may be selectively shielded by a door (not illustrated).

The chuck 200 may support the substrate W in the treating space A1. The chuck 200 may heat the substrate W. In addition, the chuck 200 may be an ESC capable of chucking the substrate W using an electrostatic force. The chuck 200 may include a support plate 210, an electrostatic electrode 220, a heater 230, and a lower electrode 240 (an example of a first electrode).

The support plate 210 may support the substrate W. The support plate 210 may have a support surface for supporting the substrate W. The support plate 210 may be provided with a dielectric material. For example, the support plate 210 may be provided with a ceramic material. The electrostatic electrode 220 may be provided in the support plate 210. The electrostatic electrode 220 may be provided at a position overlapping with the substrate W when viewed from the top. When electric power is applied to the electrostatic electrode 220, the electrostatic electrode 220 may form an electric field by an electrostatic force capable of chucking the substrate W. The electric field may transfer an attractive force to the substrate W so that the substrate W is chucked in a direction toward the support plate 210.

In addition, the substrate treating apparatus 10, for example, the chuck 200 may include first power supply modules 222 and 224 for applying the electric power to the electrostatic electrode 220. The first power supply modules 222 and 224 may include an electrostatic electrode power supply 222 and an electrostatic electrode switch 224. The electric power may be applied to the electrostatic electrode 220 according to on/off of the electrostatic electrode switch 224.

The heater 230 may heat the substrate W. The heater 230 may heat the substrate W by increasing the temperature of the support plate 210. In addition, when the electric power is applied to the heater 230, the heater 230 may generate heat. The heater 230 may be a heating element such as tungsten. However, a type of the heater 230 is not limited thereto, and may be variously modified as known heaters 230. For example, the heater 230 may control the temperature of the support plate 210 to 85° C. to 130° C.

In addition, the substrate treating apparatus 10, for example, the chuck 200 may include second power supply modules 232 and 234 (an example of a heater power supply module) for applying the electric power to the heater 230. The second power supply modules 232 and 234 may include a heater power supply 232 and a heater power supply switch 234. The electric power may be applied to the heater 230 according to on/off of the heater power supply switch 234.

The lower electrode 240 may generate plasma in the treating space A1. The lower electrode 240 may have a plate shape. The lower electrode 240 may be an electrode facing the shower head 300 to be described below. When the electric power is applied to the lower electrode 240, the lower electrode 240 forms an electric field in the treating space A1, and the formed electric field may excite the process gases G1 and G2 introduced (supplied) into the treating space A1 to generate the plasma P. In addition, the substrate treating apparatus 10, for example, the chuck 200 may include lower power supply modules 242 and 244 for applying the electric power to the lower electrode 240. The lower power supply modules 242 and 244 may include a lower power supply 242 as an RF source and a lower power supply switch 244. The electric power may be applied to the lower electrode 240 according to on/off of the lower power supply switch 244.

The shower head 300 may be disposed on the housing 100. The shower head 300 may be disposed between the ion blocker 500 to be described below and the treating space A1. The shower head 300 may be grounded. The shower head 300 may be grounded to function as an electrode facing the lower electrode 240 described above. In addition, a plurality of holes 302 may be formed in the shower head 300. The holes 302 may be formed to extend from an upper surface to a lower surface of the shower head 300. That is, the holes 302 may be formed through the shower head 300. The holes 302 may allow the treating space A1 to be in fluid communication with the plasma space A2 to be described below. In addition, the holes 302 may allow the treating space A1 to be in fluid communication with the mixing space A3 to be described below.

In addition, a gas inlet 304 may be formed in the shower head 300. The gas inlet 304 may be connected to a second gas line 706 to be described below. The gas inlet 304 may be configured to supply the first process gas G1 toward the mixing space A3. The gas inlet 304 may be configured to supply a process gas to an edge area of the mixing space A3. The gas inlet 304 may be configured to pass through the mixing space A3 (alternatively, to indirectly pass through the plasma space A2), but may be configured not to pass through the treating space A1.

The heating member 400 may be disposed on the shower head 300. The heating member 400 may be a ring heater having a ring shape when viewed from the top. The heating member 400 generates heat to raise the temperature of the mixing space A3 so that the plasma P from which the ions I are removed and the first process gas G1 are mixed more effectively.

The ion blocker 500 may partition the plasma space A2 and the mixing space A3 (furthermore, indirectly partition the plasma space A2 and the treating space A1). The ion blocker 500 may be disposed between the upper electrode 600 and the treating space A1.

The ion blocker 500 may be disposed on the heating member 400. The ion blocker 500 may be grounded. The ion blocker 500 is grounded to remove ions contained in the plasma P when the plasma P generated in the plasma space A2 flows into the mixing space A3, furthermore, the treating space A1. For example, the plasma P generated in the plasma space A2 may substantially include only a radical R because the ions I are removed while passing through the ion blocker 500.

In addition, the ion blocker 500 may be grounded to function as an electrode facing the upper electrode 600 to be described below. A plurality of through holes 502 may be formed in the ion blocker 500. The through holes 502 may be formed through the ion blocker 500. The through holes 502 may be in fluid communication with the plasma space A2 and the mixing space A3. The through holes 502 may be in fluid communication with the plasma space A2 and the treating space A1.

In addition, a gas supply port 504 may be formed in the ion blocker 500. The gas supply port 504 may be connected to a first gas line 704 to be described below. The gas supply port 504 may be configured to supply a process gas to the mixing space A3. The gas supply port 504 may be configured to supply a process gas to a central area of the mixing space A3. The gas supply port 504 may be configured to pass through the mixing space A3 (alternatively, to indirectly pass through the treating space A1), but may be configured not to pass through the plasma space A2.

The upper electrode 600 may have a plate shape. The upper electrode 600 may generate plasma. Upper power supply modules 602 and 604 (an example of an electrode power supply module) included in the substrate treating apparatus 10 may apply electric power to the upper electrode 600. The upper power supply modules 602 and 604 may include an upper power supply 602 as an RF source and an upper power supply switch 604. The electric power may be applied to the upper electrode 600 according to on/off of the upper power supply switch 604. When the electric power is applied to the upper electrode 600, an electric field is formed between the ion blocker 500 functioning as an opposite electrode and the upper electrode 600 and excites the second process gas G2 to be described below in the plasma space A2 to generate plasma. In addition, the insulating member DR provided with an insulating material may be disposed between the upper electrode 600 and the ion blocker 500. The insulating member DR may have a ring shape when viewed from the top.

The gas supply units 700 and 800 may supply the process gases G1 and G2 excited to the plasma P state. The gas supply units 700 and 800 may include the first gas supply unit 700 and the second gas supply unit 800. Hereinafter, the process gas supplied by the first gas supply unit 700 is referred to as the first process gas G1, and the process gas supplied by the second gas supply unit 800 is referred to as the second process gas G2.

The first gas supply unit 700 may supply the first process gas G1 including nitrogen and hydrogen as neutral gases (radicals) from which ions are removed by the ion blocker 500. For example, the first gas supply unit 700 may supply the process gas to the mixing space A3. The first gas supply unit 700 may supply the process gas to the treating space A1 by injecting the process gas into the mixing space A3. The first gas supply unit 700 may include a first gas supply source 701, a main gas line 703, a first gas line 704, and a second gas line 706. One end of the main gas line 703 may be connected with the first gas supply source 701, and the other end of the main gas line 703 may be branched into the first gas line 704 and the second gas line 706. The first gas line 704 may be connected to the gas supply port 504 described above. In addition, the second gas line 706 may be connected to the gas inlet 304 described above.

The first process gas G1 supplied by the first gas supply unit 700 may be at least one or more of He, Ar, Xe, $NH_3$, $H_2$, $N_2$, O, $NF_3$, and $F_2$. For example, the first process gas G1 may be gas including $NH_3$.

The second gas supply unit 800 may supply the process gas to the plasma space A2. The second gas supply unit 800 may supply the process gas to the mixing space A3 and the treating space A1 by injecting the process gas into the plasma space A2. The second gas supply unit 800 includes a second gas supply source 801 and a gas channel 803. One end of the gas channel 803 may be connected with the second gas supply source 801, and the other end thereof may be in communication with the plasma space A2.

The second process gas G2 supplied by the second gas supply unit 800 may be at least one or more of $NF_3$, $F_2$, He, Ar, Xe, $NH_3$, $H_2$, and $N_2$. For example, the second process gas G2 may include He and $NF_3$. For example, the second process gas G2 may also further include $H_2$—.

The exhaust unit 900 may discharge the process gases G1 and G2 supplied to the treating space A1, process by-products, and the like. The exhaust unit 900 may control the pressure of the treating space A1. The exhaust unit 900 may include a decompression member 902, and a decompression line 904. The decompression member 902 may be a pump.

However, the present invention is not limited thereto and may be variously modified to known devices for providing decompression.

The controller 1000 may control the substrate treating apparatus 10, specifically, components of the substrate treating apparatus 10. For example, the controller 1000 may control the gas supply units 700 and 800, the first power supply modules 222 and 224, the second power supply modules 232 and 234, the decompression member 902, the lower power supply modules 242 and 244, the upper power supply module 602 and 604, and the like.

The controller 1000 may include a process controller consisting of a microprocessor (computer) for executing a control of the substrate treating apparatus 10, a keyboard for performing a command input operation and the like to allow an operator to manage the substrate treating apparatus, a user interface consisting of a display and the like for visualizing and displaying an operating situation of the substrate treating apparatus, and a memory unit for storing control programs for executing the processing executed in the substrate treating apparatus by the control of the process controller, or programs, that is, treatment recipes for executing the treatment in each configuration unit according to various data and treating conditions. In addition, the user interface and the memory unit may be connected to the process controller. The treatment recipes may be stored in a storage medium in the memory unit, and the storage medium may be a hard disk, and a transportable disk such as a CD-ROM, a DVD, and the like or a semiconductor memory such as a flash memory and the like.

Hereinafter, a substrate treating method according to an exemplary embodiment of the present invention will be described. The substrate treating method described below may be performed by the above-described substrate treating apparatus 10. In addition, in order to perform the substrate treating method to be described below, the controller 1000 may control the components of the substrate treating apparatus 10.

Figure 4:
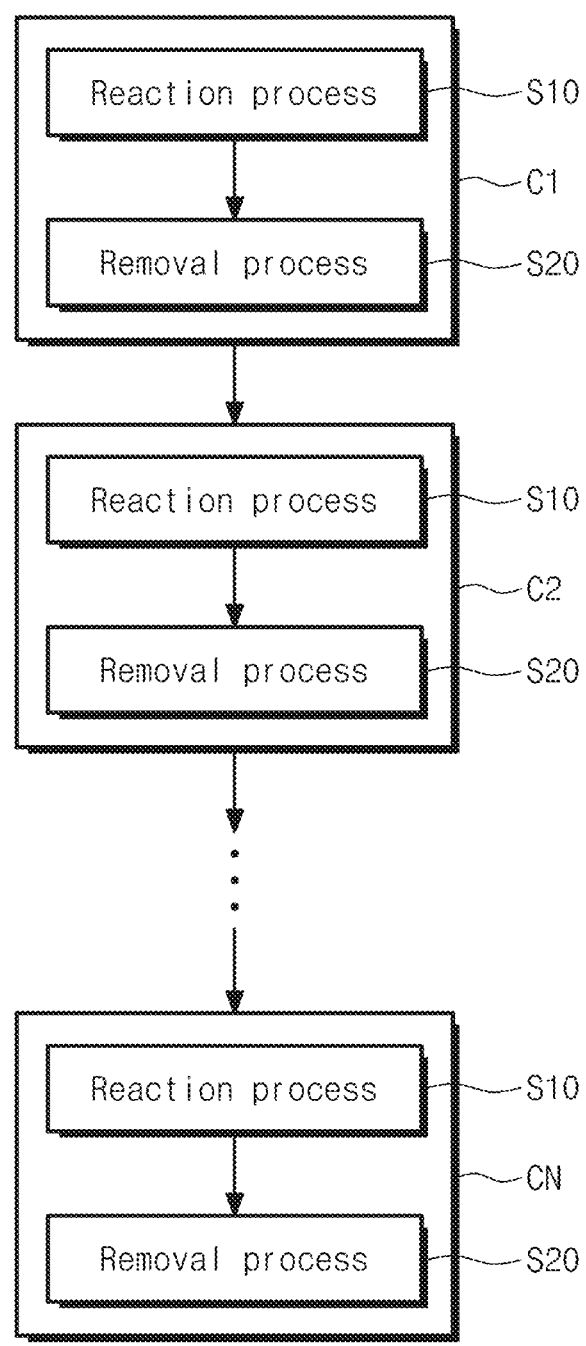
FIG. 4 is a diagram illustrating a substrate treating method according to an exemplary embodiment of the present invention.
Figure 5:
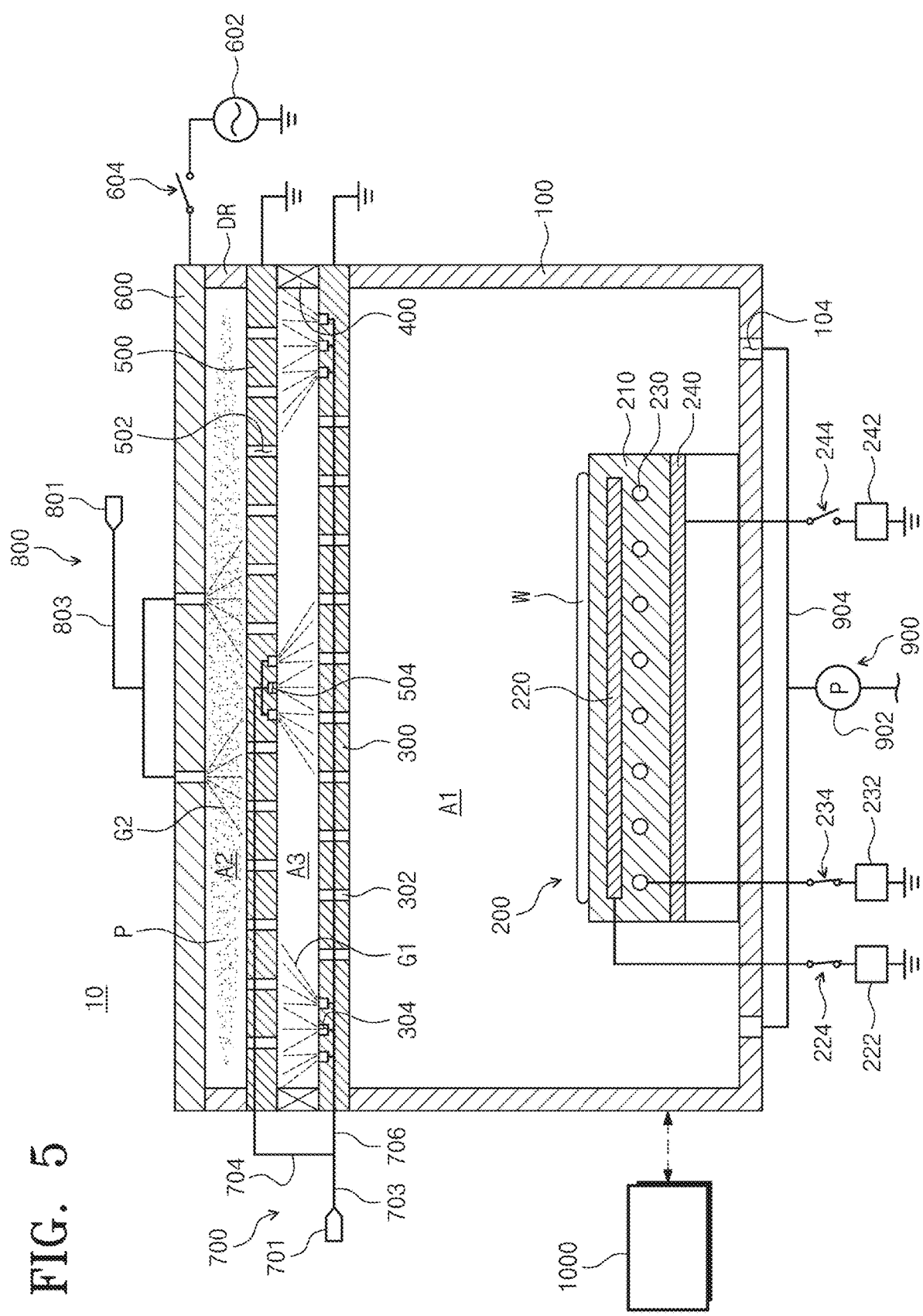
FIG. 5 is a diagram illustrating a state of the substrate treating apparatus performing a reaction process of FIG. 4.
Figure 6:
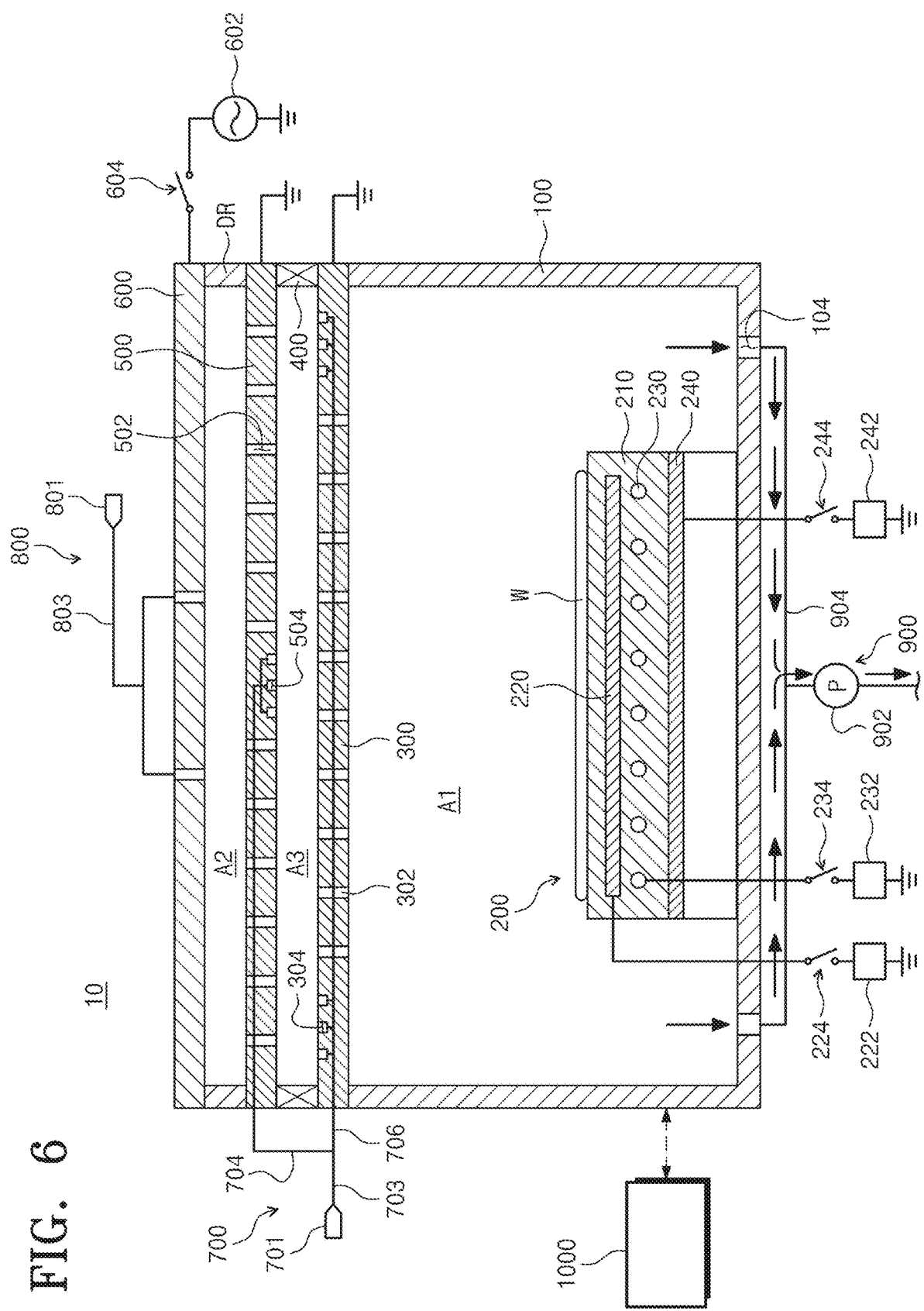
FIG. 6 is a diagram illustrating a state of the substrate treating apparatus performing a removal process of FIG. 4.

FIG. 4 is a diagram illustrating a substrate treating method according to an exemplary embodiment of the present invention. Referring to FIG. 4, the substrate treating method according to an exemplary embodiment of the present invention may include a reaction process (S10) and a removal process (S20). The reaction process (S10) may be a process of transferring an etchant to a thin film L on a substrate W. The thin film L formed on the substrate W may be provided with a material including silicon (Si). For example, the thin film L formed on the substrate W may include at least one of $Si_xO_y$ and $Si_xN_y$ (x and y are positive integers). For example, the thin film L formed on the substrate W may include at least one of $SiO_2$ and $Si_3N_4$—.

In addition, in the reaction process (S10), a second process gas G2 containing fluorine may be supplied to a plasma space A2. For example, the second process gas may be a gas including $NF_3$—. Upper power modules 602 and 604 may apply electric power to an upper electrode 600 to generate plasma P in the plasma space A2. Ions of the plasma P generated in the plasma space A2 may be removed by an ion blocker 500. That is, a neutral gas substantially including only radicals may be introduced into a mixing space A3 by the ion blocker 500. A first gas supply unit 700 may supply a first process gas G1 including $N_xH_y$ to the neutral gas (radical) from which the ions introduced into the mixing space A3 have been removed. For example, the first process gas G1 may be a gas including $NH_3$ (see FIG. 5).

The first process gas G1 including $NH_3$ supplied to the mixing space A3 and the neutral gas (radical) from which the ions are removed may react with each other to generate a reactant. The reactant may include at least one of $N_xH_yF_z$ and $H_xF_y$ (x and y are positive integers). For example, the reactant may include at least one of $NH_4F$ and $HF$. Such a reactant may be introduced into the treating space A1 and transferred to the thin film L on the substrate W. In addition, F* that does not react in the mixing space A3 may also be transferred to the thin film L on the substrate W. Such a reactant and F* may be collectively referred to as an etchant.

The removal process (S20) may be a process of removing by-products BP1 and BP2 generated by the reaction between the thin film L and the etchant. The removal process (S20) may be performed by heating the support plate 210 by the heater 230 and heating the substrate W by the heated support plate 210. In addition, the removal process (S20) may be performed by exhausting the atmosphere of the treating space A1 by the exhaust unit 900. For example, the process by-products BP1 and BP2 generated when the thin film L and the etchant react with each other may be removed from the substrate W by the heat transferred by the heater 230 and/or the reduced pressure provided to the treating space A1 by the exhaust unit 900.

The reaction process (S10) and the removal process (S20) may be repeated at least twice or more. For example, the reaction process (S10) and the removal process (S20) first performed may be referred to as a first process cycle C1. After the first process cycle C1, the reaction process (S10) and the removal process (S20) may be performed again. The reaction process (S10) and the removal process (S20) performed again may be referred to as a second process cycle C2. In addition, the reaction process (S10) and the removal process (S20) performed again after the second process cycle C2 may be referred to as a third process cycle C3. These process cycles may be performed N times. Hereinafter, as an example, process cycles performed three times will be described. That is, hereinafter, the third process cycle C3 will be described as an example of a process cycle performed finally.

In addition, the reaction process (S10) and the removal process (S20) included in one process cycle may also be performed simultaneously or sequentially. Alternatively, since the removal process (S20) starts before the reaction process (S10) is terminated, the periods thereof may only partially overlap.

Figure 7:
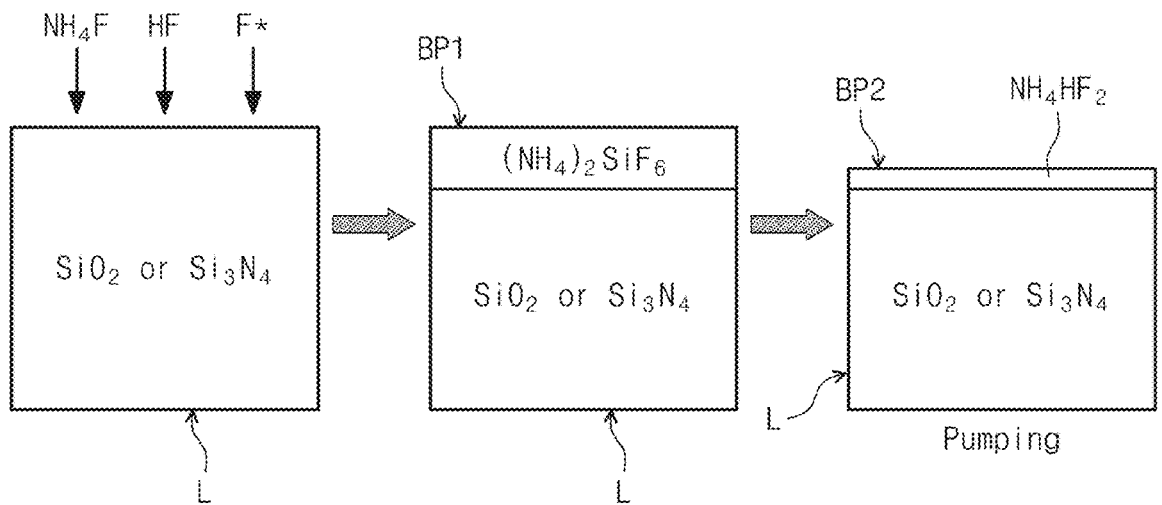
FIG. 7 is a diagram illustrating a state in which the thin film formed on the substrate is removed through a first process cycle.

FIG. 7 is a diagram illustrating a state in which the thin film formed on the substrate is removed through the first process cycle C1. Referring to FIG. 7, when the etchant is transferred to the thin film L formed on the substrate W, the thin film L and the etchant may react with each other to form the first process by-product BP1. The first process by-product BP1 may include $(NH_4)_2SiF_6$. Thereafter, when the substrate W is heated in the removal process (S20), the first process byproduct BP1 may be first decomposed and removed from the thin film L that does not react with the etchant. In this case, when the first process by-product BP1 is first decomposed, $NH_4HF_2$, which is an intermediate process by-product (hereinafter, referred to as the second process by-product BP2), may be formed. In the removal process (S20), the exhaust unit 900 adjusts the exhaust pressure to exhaust the treating space A1 and/or the time to exhaust the treating space A1 to allow the second process by-product BP2 to remain on the thin film L. That is, in the first process cycle C1, the process by-products BP1 and BP2 on the thin film L may not be fully removed, but only partially removed. The exhaust pressure and the exhaust time of the exhaust unit 900 capable of removing only partially the process by-products BP1 and BP2 on the thin film L without removing completely the process by-products BP1 and BP2 may be determined based on reference data obtained in advance through several experiments. For example, the above-described reference data may be previously stored in the controller 1000, and the controller 1000 may control the exhaust unit 900 based on the reference data.

Figure 8:
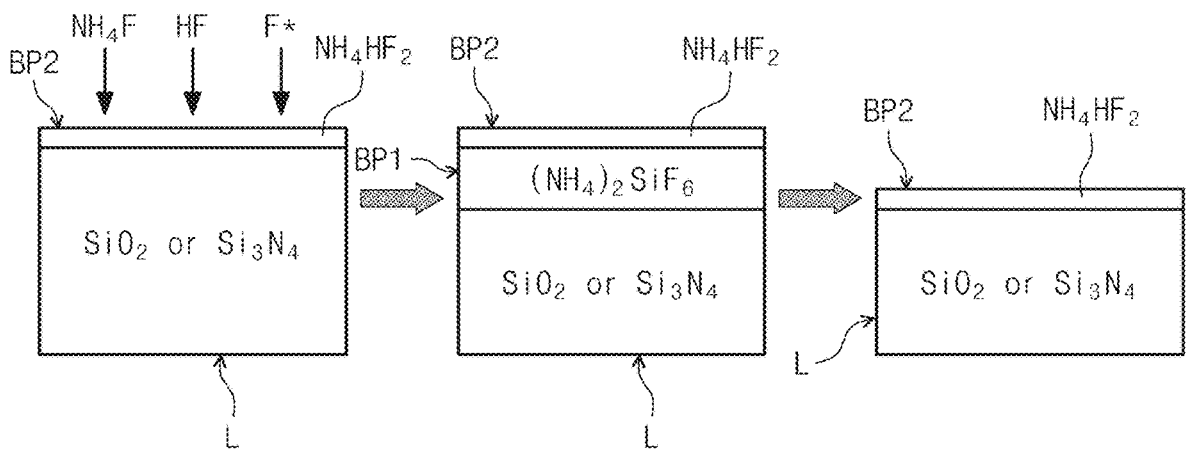
FIG. 8 is a diagram illustrating a state in which the thin film formed on the substrate is removed through a second process cycle.

FIG. 8 is a diagram illustrating a state in which the thin film formed on the substrate is removed through the second process cycle C2. Referring to FIG. 8, when the reaction process (S10) of transferring the etchant is performed again in a state where the second process by-product BP2 remains on the thin film L, the etchant and the thin film L react with each other to generate the first process by-product BP1 again. The first process by-product BP1 generated in the second process cycle C2 may be generated below the second process by-product BP2 which has been generated in the first process cycle C.

Thereafter, when the removal process (S20) is performed again, the exhaust unit 900 adjusts the exhaust pressure to exhaust the treating space A1 and/or the time to exhaust the treating space A1 to allow the second process by-product BP2 to remain on the thin film L. That is, even in the second process cycle C2, the process by-products BP1 and BP2 on the thin film L may not be fully removed, but only partially removed. The exhaust pressure and the exhaust time of the exhaust unit 900 capable of removing only partially the process by-products BP1 and BP2 on the thin film L without removing completely the process by-products BP1 and BP2 may be determined based on reference data obtained in advance through several experiments.

Figure 9:
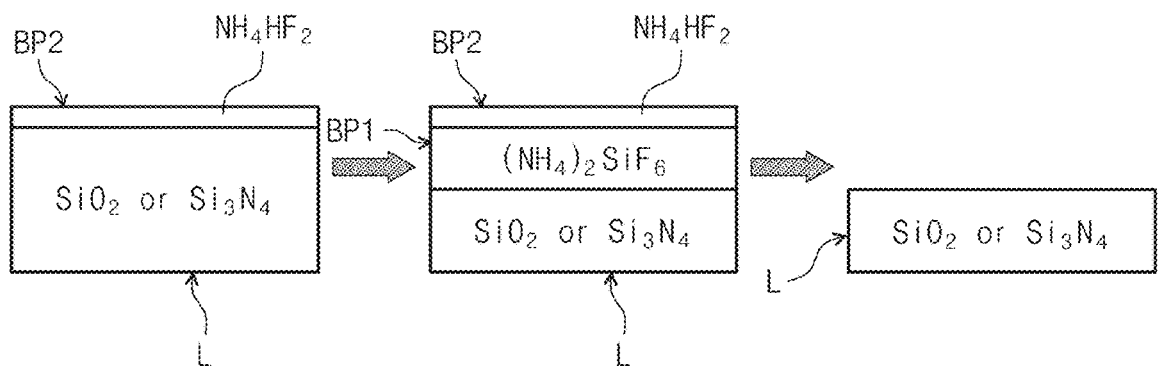
FIG. 9 is a diagram illustrating a state in which the thin film formed on the substrate is removed through a third process cycle.

FIG. 9 is a diagram illustrating a state in which the thin film formed on the substrate is removed through the third process cycle C3. Referring to FIG. 9, the third process cycle C3 may be a process cycle performed finally. In the third process cycle C3, the reaction process (S10) is again performed similarly to the above-described first and second process cycles C1 and C2. In addition, since the third process cycle C3 is the last process cycle performed on the substrate W, the process by-products BP1 and BP2 remaining on the thin film L in the removal process (S20) may be fully removed. That is, according to the substrate treating method according to an exemplary embodiment of the present invention, in the process in which the process cycles are repeatedly performed, in the removal process (S20) performed before the last among the removal processes (S20), only some of the process by-products BP1 and BP2 are removed, and in the removal process (S20) performed the last among the removal processes (S20), the process by-products BP1 and BP2 may be fully removed. Through these processes, it is possible to adjust the thickness of the thin film L by removing the thin film L formed on the substrate W, and to improve the uniformity of the roughness of the surface of the thin film L.

Hereinafter, the principle of improving the uniformity of the roughness of the surface of the thin film L will be described in more detail.

Figure 10:
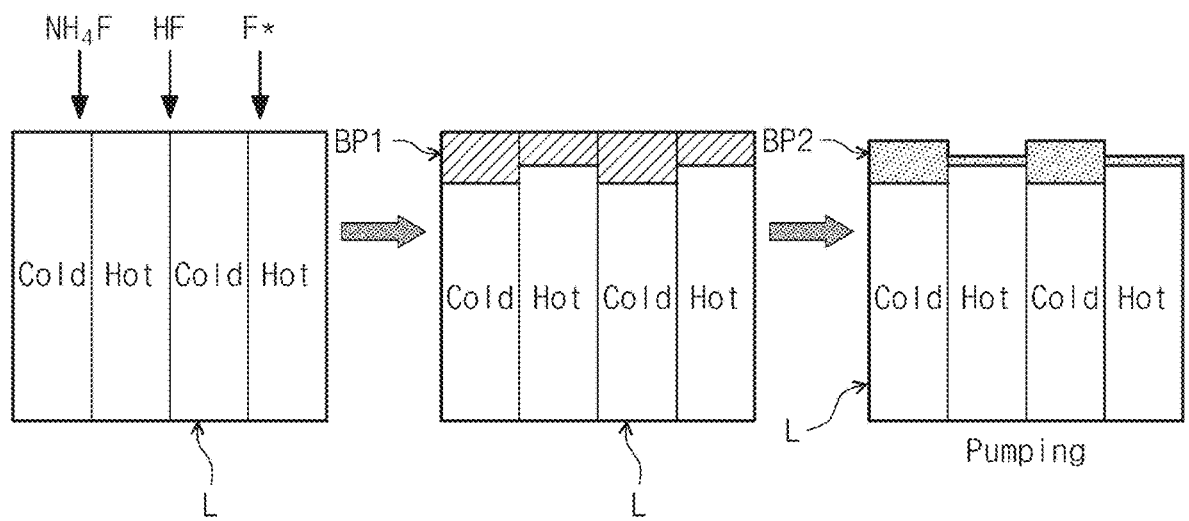
FIG. 10 is a diagram more specifically illustrating the state of the thin film in which the first process cycle is performed.

FIG. 10 is a diagram more specifically illustrating a state of the thin film L in which the first process cycle C1 is performed. Referring to FIG. 10, although the temperature of each area of the substrate W is controlled relatively uniformly by the heater 230, the temperature of each area on the substrate W inevitably causes a slight temperature difference. Accordingly, the temperature for each area of the thin film L may also vary depending on the temperature for each area of the substrate W.

The degree to which the thin film L reacts with the etchant to generate the first process by-product BP1 is determined by the amount of the etchant reaching the thin film L per unit time and the temperature of the thin film L. When the etchant is uniformly transferred to the areas of the thin film L, the degree to which the first process by-product BP1 is generated varies depending on the temperature. For example, the above-described thin film L including silicon and the above-described etchants are formed to be thicker as the temperature of the thin film L is lowered. That is, the temperature of the thin film L and the degree of generation of the first process by-product BP1 are in inverse proportion to each other. On the other hand, the degree of decomposition of the first process by-product BP1 from the thin film L is more easily decomposed as the temperature of the thin film L increases. That is, the temperature of the thin film L and the decomposition degree of the first process by-product BP1 are in proportion to each other. In this case, the thickness of the second process by-product BP2 remaining on the thin film L having a relatively high temperature is smaller than the thickness of the second process by-product BP2 remaining on the thin film L having a low temperature.

Figure 11:
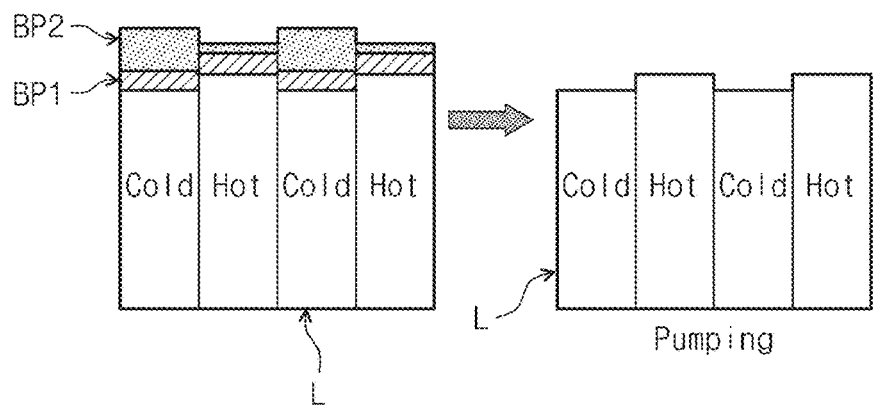
FIG. 11 is a diagram more specifically illustrating the state of the thin film in which the reaction process of the second process cycle and the removal process of the third process cycle are performed.

FIG. 11 is a diagram more specifically illustrating a state of the thin film in which the reaction process (S10) of the second process cycle C2 and the removal process (S20) of the third process cycle (C3) are performed. Thereafter, when the reaction process (S10) of the second process cycle C2 is performed, the etchant passes through the second process by-product BP2 remaining on the thin film L to react with the thin film L. Accordingly, the first process by-product BP1 is again generated below the second process by-product BP2. In this case, the thickness of the generated first process byproduct BP1 is inversely proportional to the thickness of the remaining second process byproduct BP2. That is, a deviation of the amount of the first process by-product BP1 additionally generated according to the temperature of the substrate W in the second process cycle C2 is greatly decreased as compared with a deviation of the amount of the first process by-product BP1 generated in the first process cycle C1. Thereafter, the process by-products BP1 and BP2 in the third process cycle C3, which is the last removal process, may be fully removed to effectively improve the roughness of the surface of the thin film L.

In the above-described example, it has been described as an example that the process by-products BP1 and BP2 remain by adjusting the exhaust pressure and the exhaust time of the exhaust unit 900, but the present invention is not limited thereto. For example, the process by-products BP1 and BP2 may remain by adjusting the heating temperature and/or the heating time of the heater 230. For example, the process by-products BP1 and BP2 may remain by adjusting the heating time of the heater 230 to a time in which the first process byproducts BP1 is not fully decomposed.

In addition, when the temperature deviation for each area of the substrate W is too large, it may be difficult to apply the roughness improvement mechanism described above. In order to solve this problem, a plurality of heaters 230 may be provided to heat different areas of the substrate W, and may be controlled independently of each other. The heaters 230 are independently controlled in the removal process (S20), so that the temperature deviation for each area of the substrate W is a predetermined deviation or less. Thereafter, the reaction process (S10) and the removal process (S20) are performed, so that the above-described roughness improvement mechanism may be applied.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A method for processing a substrate by removing a thin film formed on a substrate, the method comprising:
a reaction process of transferring an etchant to the thin film; and
a removal process of removing process by-products generated by reacting the thin film with the etchant, the process by-products including at least a first process by-product and a second process by-product different from the first process by-product,
wherein the reaction process and the removal process are repeated at least twice, and
wherein at least one of the removal processes includes removing at least a portion of the first process by-product and maintaining at least a portion of the second process by-product.

2. The method of claim 1, wherein
the other one of the removal processes is to remove fully the process by-products.

3. The method of claim 2, wherein
another one of the removal processes is a removal process performed the last among the removal processes.

4. The method of claim 1, wherein
the removal process is performed by heating the substrate and exhausting an atmosphere of a treating space in which the substrate is placed.

5. The method of claim 4, wherein
the amount of the process by-products removed in the removal process is adjusted by controlling a time for exhausting the atmosphere of the treating space and/or an exhaust pressure for exhausting the treating space.

6. The method of claim 5, wherein
in at least one of the reaction process or the removal process, at least two or more heaters for heating different areas of the substrate are independently controlled so that a temperature deviation for each area of the substrate is decreased.

7. The method of claim 4, wherein
the thin film is provided with a material containing silicon.

8. The method of claim 7, wherein
the etchant includes at least one of nitrogen, hydrogen, and fluorine.

9. A method for treating a substrate on which a thin film containing silicon is formed, the method comprising:
a reaction process of transferring an etchant to the thin film; and
a removal process of removing process by-products generated by reacting the thin film with the etchant, wherein the reaction process and the removal process are performed at least two or more times,
wherein at least any one of the removal processes is includes removing only partially the process by-products, and
wherein the reaction process includes
generating plasma by exciting a gas,
generating a neutral gas by removing ions from the generated plasma, and
generating the etchant by supplying a process gas to the neutral gas.

10. The method of claim 9, wherein
the generating plasma includes exciting the gas containing fluorine, and
generating the neutral gas contains nitrogen and hydrogen.

11. The method of claim 10, wherein
the etchant includes at least one of $N_xH_yF_z$ and $H_xF_y$.

12. The method of claim 11, wherein
the etchant includes at least one of $NH_4F$ and $HF$.

13. The method of claim 12, wherein
the thin film includes at least one of $SiO_x$ and $Si_xN_y$.

14. The method of claim 13, wherein
the thin film includes at least one of $SiO_2$ and $Si_3N_4$.

15. The method of claim 9, wherein
the reaction process and the removal process are repeated at least twice or more.

16. The method of claim 15, wherein
the removal process performed before the last among the removal processes is performed by removing only partially the process by-products, and
the removal process performed the last among the removal processes is performed by removing fully the process by-products.

* * * * *